US012683625B2

(12) United States Patent
Tan

(10) Patent No.: US 12,683,625 B2
(45) Date of Patent: Jul. 14, 2026

(54) ANALOG-TO-DIGITAL CONVERTER AND OPERATING METHOD THEREOF

(71) Applicant: SG MICRO CORP, Beijing (CN)

(72) Inventor: Lei Tan, Beijing (CN)

(73) Assignee: SG MICRO CORP, Beijing (CN)

( * ) Notice: Subject to any disclaimer, the term of this patent is extended or adjusted under 35 U.S.C. 154(b) by 101 days.

(21) Appl. No.: 18/713,862

(22) PCT Filed: Aug. 18, 2022

(86) PCT No.: PCT/CN2022/113211
§ 371 (c)(1),
(2) Date: May 28, 2024

(87) PCT Pub. No.: WO2023/124118
PCT Pub. Date: Jul. 6, 2023

(65) Prior Publication Data
US 2024/0356560 A1 Oct. 24, 2024

(30) Foreign Application Priority Data
Dec. 27, 2021 (CN) .......................... 202111617749.7

(51) Int. Cl.
*H03M 1/12* (2006.01)
*H03M 1/46* (2006.01)

(52) U.S. Cl.
CPC ........... *H03M 1/466* (2013.01); *H03M 1/462* (2013.01)

(58) Field of Classification Search
CPC ...... H03M 1/468; H03M 1/466; H03M 3/426; H03M 1/0854; H03M 1/38; H03M 1/164;
(Continued)

(56) References Cited

U.S. PATENT DOCUMENTS 6,313,778 B1 * 11/2001 Ignjatovic ............. H03M 1/207
341/155
8,106,809 B2 1/2012 Groenwold
(Continued)

FOREIGN PATENT DOCUMENTS

CN 102422539 B 6/2012
CN 101640539 B 4/2013
(Continued)

OTHER PUBLICATIONS

Yang, Jiaqi et al., "A Noise-Shaping SAR ADC with Dual Error-Feedback Paths and Alternate DACs," 2017 IEEE 12th International Conference on ASIC (ASICON), Jan. 11, 2018 (Jan. 11, 2018).
(Continued)

*Primary Examiner* — Linh V Nguyen
(74) *Attorney, Agent, or Firm* — Westman, Champlin & Koehler, P.A.

(57) ABSTRACT

The present invention discloses an analog-to-digital converter and an operating method thereof. The analog-to-digital converter includes a plurality of sub-periods in one conversion frame, and performs at least the following operations in each sub-period: a residual charge storage phase, an integration phase, a charge redistribution phase, and an SAR conversion phase. The analog-to-digital converter includes a capacitive digital-to-analog converter and an auxiliary capacitor. The auxiliary capacitor stores residual charge generated by the capacitive digital-to-analog converter in a previous sub-period at the residual charge storage phase. A weight capacitor array of the capacitive digital-to-analog converter integrates an input current signal at the integration phase. The integration charge of the current sub-period is transferred to the weight capacitor array at the charge redistribution phase. It ensures that the analog-to-digital converter continuously integrates the input current signal in
(Continued)

the entire conversion frame, improving time utilization and signal-to-noise ratio.

19 Claims, 3 Drawing Sheets

(58) Field of Classification Search
CPC .. H03M 1/462; H03M 1/0626; H03M 1/1245; H03M 1/002; H03M 1/12; H03M 1/14; H03M 3/458; H03M 3/46; H03M 1/08; H03M 1/145; H03M 3/464; H03M 1/0604; H03M 1/0863; H03M 1/1009; H03M 1/162; H03M 1/42; H03M 1/46; H03M 1/804; H03M 3/398; H03M 3/494; H03M 1/00; H03M 1/06; H03M 1/0668; H03M 1/0678; H03M 1/0695; H03M 1/10; H03M 1/1014; H03M 1/1023; H03M 1/1038; H03M 1/1042; H03M 1/1061; H03M 1/1071; H03M 1/1205; H03M 1/125; H03M 1/1265; H03M 1/16; H03M 1/167; H03M 1/168; H03M 1/201; H03M 1/303; H03M 1/362; H03M 1/40; H03M 1/403; H03M 1/442; H03M 1/50; H03M 1/502; H03M 1/56; H03M 1/60; H03M 1/66; H03M 3/32; H03M 3/342; H03M 3/344; H03M 3/368; H03M 3/37; H03M 3/436; H03M 3/438; H03M 3/442; H03M 3/45; H03M 3/452; H03M 3/454; H03M 3/50
USPC .......................... 341/155, 161, 162, 163, 172
See application file for complete search history.

(56) References Cited

U.S. PATENT DOCUMENTS

| | | |
|---|---|---|
| 10,044,368 B2 | 8/2018 | Kropfitsch et al. |
| 10,312,926 B2 | 6/2019 | Maurino |
| 10,348,319 B1 | 7/2019 | Monangi et al. |
| 10,615,818 B1 | 4/2020 | Singh et al. |
| 11,581,900 B2 | 2/2023 | Alpman et al. |
| 2010/0289682 A1 | 11/2010 | Groenwold |
| 2016/0134300 A1* | 5/2016 | Wang ...................... H03M 1/42 |
| | | 341/172 |
| 2017/0026053 A1* | 1/2017 | Lee ...................... H03M 1/1245 |
| 2018/0115321 A1 | 4/2018 | Kropfitsch et al. |
| 2018/0152656 A1* | 5/2018 | Matsumoto ............. H03M 1/46 |
| 2018/0309458 A1 | 10/2018 | Bandyopadhyay et al. |
| 2019/0131989 A1 | 5/2019 | Maurino |
| 2019/0207620 A1* | 7/2019 | Lee ...................... H03M 3/494 |
| 2020/0119740 A1* | 4/2020 | Spirer ................... H03L 7/0991 |
| 2020/0200603 A1* | 6/2020 | Xu ........................... H03M 1/12 |
| 2021/0313997 A1 | 10/2021 | Alpman et al. |
| 2022/0407530 A1* | 12/2022 | Strandvik ........... H03M 1/0626 |
| 2023/0291413 A1* | 9/2023 | Park ........................ H03M 1/38 |
| 2023/0387929 A1* | 11/2023 | Sedighi .............. H03M 1/0854 |
| 2024/0137040 A1* | 4/2024 | Sanyal ................. H03M 1/145 |
| 2024/0291502 A1* | 8/2024 | Chen ..................... H03M 3/494 |

FOREIGN PATENT DOCUMENTS

| | | |
|---|---|---|
| CN | 104316087 A | 1/2015 |
| CN | 104467847 A | 3/2015 |
| CN | 104702290 A | 6/2015 |
| CN | 107947797 A | 4/2018 |
| CN | 107979375 A | 5/2018 |
| CN | 207504850 U | 6/2018 |
| CN | 109728812 A | 5/2019 |
| CN | 109787633 A | 5/2019 |
| CN | 110113051 A | 8/2019 |
| CN | 110504971 A | 11/2019 |
| CN | 110535466 A | 12/2019 |
| CN | 110739968 A | 1/2020 |
| CN | 111211783 A | 5/2020 |
| CN | 111900988 A | 11/2020 |
| CN | 112104374 A | 12/2020 |
| CN | 112564709 A | 3/2021 |
| CN | 112713898 A | 4/2021 |
| CN | 112929028 A | 6/2021 |
| CN | 113114257 A | 7/2021 |
| CN | 113315518 A | 8/2021 |
| CN | 110492885 B | 5/2023 |

OTHER PUBLICATIONS

International Search Report (including English translation) and Written Opinion for International Application No. PCT/CN2022/113211, dated Oct. 28, 2022, 10 pages.

* cited by examiner

200

ANALOG-TO-DIGITAL CONVERTER AND OPERATING METHOD THEREOF

CROSS REFERENCE TO RELATED APPLICATION(S)

The present application is a Section 371 National Stage Application of International Application No. PCT/CN2022/113211, filed on Aug. 18, 2022, which published as WIPO Publication No. 2023/124118 A1, on Jul. 6, 2023, not in English, which claims priority to a Chinese patent application No. 202111617749.7, filed on Dec. 27, 2021, and entitled "ANALOG-TO-DIGITAL CONVERTER AND OPERATING METHOD THEREOF", the contents of which are incorporated herein by reference in their entireties.

TECHNICAL FIELD

The present disclosure relates to the technical field of semiconductor integrated circuits, and more particularly, to an integrated circuit and a method of operating the same.

BACKGROUND

An analog to digital converter (ADC) is component that can convert a continuous analog signal into a discrete digital signal to be processed by computers. It is a key component of the interface between analog and digital systems. It has been widely used in radar, communication, measurement and control, medical, instrumentation, image and audio fields for a long time. With continuous development of modern technology, the requirements for speed and resolution in these fields increase, and the requirements for analog-to-digital converters also increase.

Currently, the analog-to-digital converters have mainly two categories: Nyquist analog-to-digital converters and oversampling analog-to-digital converters. One of the most representative types of Nyquist analog-to-digital converters is a Successive Approximation Register ADC (SAR ADC). The SAR ADC mainly has a digital logic unit structure. As shown in FIG. 1, the SAR ADC 100 includes a sampling and holding circuit 110, a register comparator 120, a SAR logic control circuit 130, and a capacitive digital-to-analog converter (DAC) 140. The sampling and holding circuit 110 samples an input analog signal Vin according to a sampling clock and provides it to the register comparator 120. The register comparator 120 compares the analog input signal Vin with an analog voltage generated by the capacitive digital-to-analog converter 140. The SAR logic control circuit 130 generates a logic control signal according to a comparison result of the register comparator 120 for feedback control of the capacitive digital-to-analog converter 140 to generate a new analog voltage to approximate the input analog signal, until the analog voltage is approximately equal to the input analog signal. The digital output corresponding to the analog voltage is an output Dout of the SAR ADC 100. The structure of SAR ADC is simple and has high power and speed. However, due to the existence of comparator noise and DAC establishment error, the accuracy of SAR ADC is generally limited to 8~12 bits. Thus, the SAR ADC is widely used in the field of medium speed and medium precision.

The most widely-used oversampling analog-to-digital converter is Σ-Δ ADC, which has a structural block diagram as shown in FIG. 2. The Σ-Δ ADC200 includes a Σ-Δ modulator and a digital filter and decimation circuit 250. The Σ-Δ modulator includes an adder 210, an integrator 220, a register comparator 230, and a feedback loop including a 1-bit DAC 240, which is a simple switch that couples a negative input terminal of the differential amplifier to a positive or negative reference voltage. The function of the feedback DAC is to maintain an average output of the integrator close to the reference level of the comparator. The Σ-Δ modulator samples an input signal Vin at a very high sampling frequency, and performs low-bit quantization of the difference between two samples to obtain a 1-bit data stream represented by a low-bit digital code, which is then decimated by the digital filter and decimation circuit 250 to obtain a high-resolution digital signal Dout with linear pulse code modulation. Oversampling and noise shaping techniques are two key technologies applied in a Σ-Δ modulator, which are respectively used to reduce and remove noise in a band and can greatly improve the accuracy of the analog-to-digital converter. However, the 1-bit quantizer has a high oversampling ratio required for suppressing quantization noise, which limits a conversion speed. On the other hand, the oversampling technology can be used to improve dynamic range, signal-to-noise ratio and other performance of Nyquist ADCs (such as SAR ADCs and pipeline ADCs). These ADCs has high-speed characteristics for supporting oversampling, but lacks noise shaping capabilities which cannot meet the needs of high Signal to Noise Ratio (SNR).

SUMMARY

In view of this, it is an object of the present disclosure to provide an analog-to-digital converter and a method of operating the same, which can balance both a resolution and a conversion speed of the analog-to-digital converter.

According to an aspect of an embodiment of the present disclosure, there is provided an analog-to-digital converter having a plurality of sub-periods in one conversion frame, and the analog-to-digital converter performs at least the following operations in each sub-period: a residual charge storage phase, an integration phase, a charge redistribution phase, and an SAR conversion phase, wherein the analog-to-digital converter comprises: a capacitive digital-to-analog converter, comprising a weight capacitor array that generates residual charges by switching; an auxiliary capacitor, configured to store residual charge generated by the capacitive digital-to-analog converter in a previous sub-period at the residual charge storage phase, integrate an input current signal in addition to the weight capacitor array at the integration phase, and transfer the integration charge for the current sub-period to the weight capacitor array at the charge redistribution phase; an amplifier that is coupled to the capacitive digital-to-analog converter and the auxiliary capacitor for performing charge transfer between the auxiliary capacitor and the weight capacitor array of the capacitive digital-to-analog converter; a comparator that has an input being coupled to an output terminal of the amplifier, and is used for quantizing the output terminal of the amplifier to obtain a digital code; an SAR logic control circuit for controlling switching operations of the capacitive digital-to-analog converter according to the digital code at the SAR conversion phase, and continuously generating various bits in a successive approximation manner, until the end of quantization; and a digital filter and decimation circuit for averaging a plurality of digital codes output from the SAR logic control circuit to obtain an output digital signal corresponding to the input current signal.

Optionally, the one conversion frame of the analog-to-digital converter further includes an initialization phase, at which the weight capacitor array of the capacitive digital-to-analog converter and the auxiliary capacitor are both charged to a preset potential, Optionally, each sub-period of the conversion frame further includes a reset phase after the residual charge storage phase, at which the weight capacitor array of the capacitive digital-to-analog converter is charged again to the preset potential.

Optionally, the analog-to-digital converter is configured to: couple the auxiliary capacitor to a negative input terminal and an output terminal of the amplifier at the residual charge storage phase to extract residual charge in the weight capacitor array by the amplifier.

Optionally, the analog-to-digital converter is configured to: couple the auxiliary capacitor and the weighted capacitor array of the capacitance-type digital-to-analog converter respectively between a preset reference voltage and the input current signal at the integration stage to integrate the input current signal.

Optionally, the analog-to-digital converter is configured to: couple the weight capacitor array of the capacitive digital-to-analog converter between a negative input terminal and an output terminal of the amplifier at the charge redistribution phase to extract integration charge on the auxiliary capacitor by the amplifier.

Optionally, the analog-to-digital converter further comprises a plurality of switches, the plurality of switches being switched to control connection states of the auxiliary capacitor, the capacitive digital-to-analog converter, and the amplifier at different phases.

Optionally, the plurality of switches comprises at least a first to a fourth switch, the first switch is used to couple the negative input terminal and the output terminal of the amplifier, the second switch is used to couple a lower end of the weight capacitor array to the input current signal, the third switch is used to couple an upper end of the auxiliary capacitor with a reference voltage or an output terminal of the amplifier, the fourth switch is used to couple an upper end of the weight capacitor array with the reference voltage or the output terminal of the amplifier.

Optionally, the first switch is controlled by a first signal, the second switch is controlled by complementary signals of a third signal and a fifth signal, the third switch is controlled by a second signal and a complementary signal of the second signal, the fourth switch is controlled by a fifth signal and a complementary signal of the fifth signal, Optionally, the weight capacitor array is a binary capacitor array.

According to another aspect of an embodiment of the present disclosure, there is provided a method of operating the analog-to-digital converter described above, comprising: storing residual charge that is generated by switching operations of the capacitive digital-to-analog converter in a previous sub-period into an auxiliary capacitor; integrating an input current signal using both the auxiliary capacitor and a weighted capacitor array of the capacitive digital-to-analog converter; transferring integration charge accumulated on the auxiliary capacitor in the current sub-period to the weight capacitor array; quantizing an output of the capacitive digital-to-analog converter into a digital code, controlling switching operations of the capacitive digital-to-analog converter according to the digital code by the SAR logic control circuit, and continuously generating various bits in a successive approximation manner, until the end of quantization; repeating the above steps, and averaging a plurality of digital codes output from the SAR logic control circuit to obtain an output digital signal corresponding to the input current signal.

Optional, the method further comprises: an initialization phase at which a weight capacitor array of the capacitive digital-to-analog converter and the auxiliary capacitor are both charged to a preset potential, wherein the preset potential is equal to a voltage difference between a preset reference voltage and an offset voltage of the amplifier.

Optionally, the step of storing residual charge that is generated by the switching operations of the capacitive digital-to-analog converter in a previous sub-period into the the auxiliary capacitor further comprises: charging the weight capacitor array of the capacitive digital-to-analog converter again to the preset potential.

Optional, the method further comprises: coupling the amplifier to the capacitive digital-to-analog converter and the auxiliary capacitor, respectively, to achieve charge transfer between the auxiliary capacitor and the weight capacitor array of the capacitive digital-to-analog converter.

Optionally, the step of storing the residual charge generated by the switching operations of the capacitive digital-to-analog converter in the previous sub-period into the auxiliary capacitor comprises: coupling the auxiliary capacitor to an negative input terminal and an output terminal of the amplifier to extract residual charge in the weight capacitor array by the amplifier.

Optionally, the step of integrating an input current signal using both the auxiliary capacitor and the weight capacitor array of the capacitive digital-to-analog converter comprises: coupling the auxiliary capacitor and the weight capacitor array of the capacitive digital-to-analog converter respectively between a preset reference voltage and the input current signal to integrate the input current signal.

Optionally, the step of transferring integration charge accumulated on the auxiliary capacitor in the current sub-period to the weight capacitor array comprises: coupling the weight capacitor array of the capacitive digital-to-analog converter between a negative input terminal and an output terminal of the amplifier to extract integration charge accumulated on the auxiliary capacitor by the amplifier.

Optional, the method further comprises: providing a plurality of switches to control connection states of the auxiliary capacitor, the capacitive digital-to-analog converter, and the amplifier at different phases by switching the plurality of switches.

Optionally, the step of providing the plurality of switches comprises: coupling an negative input terminal and an output terminal of the amplifier by a first switch, and/or coupling a lower end of the weight capacitor array to the input current signal by a second switch, and/or coupling an upper end of the auxiliary capacitor to a reference voltage or the output terminal of the amplifier by a third switch, and/or coupling an upper end of the weight capacitor array to the reference voltage or the output terminal of the amplifier by a fourth switch.

In summary, the analog-to-digital converter according to the present disclosure includes a capacitive digital-to-analog converter and an auxiliary capacitor. With the design that the auxiliary capacitor and the capacitive digital-to-analog converter store and decimate charges therebetween, it ensures that the analog-to-digital converter performs continuous integration of an input current signal in the entire conversion frame. Thus, the time utilization rate and the signal-to-noise ratio are improved.

Moreover, in the analog-to-digital converter according to the present disclosure, the input current signal is preliminarily quantized using an SAR ADC, and then a residual error after the initial quantization is decimated by an auxiliary capacitor, and then is converted by integrated analog-to-digital conversion. Residual errors after a plurality of times of conversions are randomly distributed within a sampling bandwidth of one weight value of one LSB, and thus appears as an ideal white noise. Therefore, not only an quantization error of the DAC can be eliminated, but also a convergence rate of quantization can be increased, while balancing the resolution and the conversion speed of the SAR ADC.

Furthermore, the analog-to-digital converter according to the present disclosure employs the weight capacitor array of a capacitive digital-to-analog converter as primary integration capacitors. The auxiliary capacitor is only responsible for maintaining uninterrupted integration at the integration phase. Therefore, it can be implemented using a small-capacity capacitor, simplifying the engineering process and reducing both the circuit area and cost.

BRIEF DESCRIPTION OF THE DRAWINGS

The foregoing and other objects, features and advantages of the present disclosure will become clearer by the following description of embodiments of the present disclosure with reference to the accompanying drawings.

DETAILED DESCRIPTION

Figure 1:
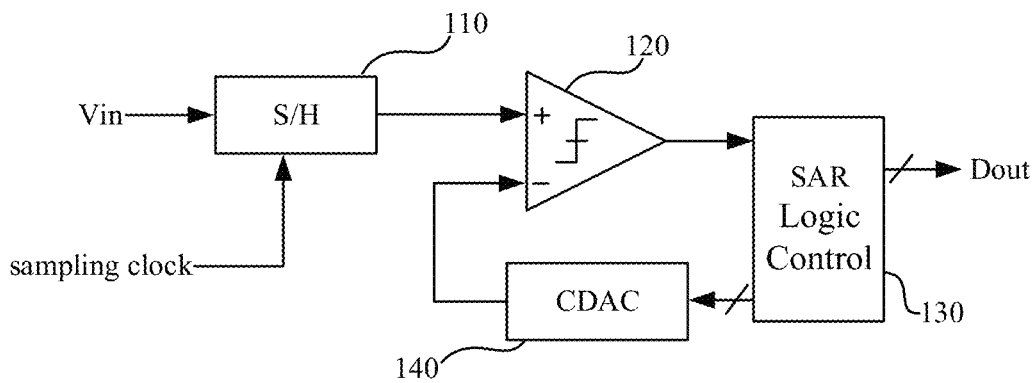
FIG. 1 shows a schematic diagram of a structure of a successive approximation analog-to-digital converter.
Figure 2:
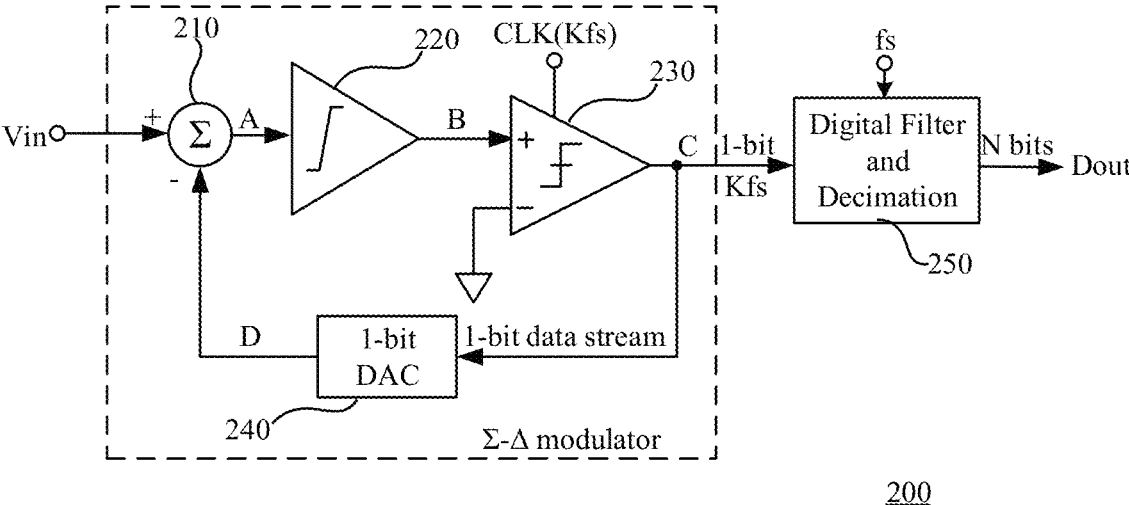
FIG. 2 shows a schematic diagram of a structure of a $\Sigma$-$\Delta$ analog-to-digital converter.

The present disclosure will be described in more detail below with reference to accompanying drawings. In various figures, the same elements are denoted by similar reference numerals. For the sake of clarity, various parts in the accompanying drawings are not drawn to scale. Moreover, certain well-known parts may not be shown in the figures.

Many specific details of the present disclosure, such as the structure, material, dimensions, treatment processes, and techniques of the components, are described below for more clear understanding of the present disclosure. However, as will be appreciated by those skilled in the art, the present disclosure may not be practiced in accordance with these specific details.

It should be understood that in the following description, the word "circuitry" may include single or multiple combinations of hardware circuits, programmable circuits, state machine circuits, and/or components capable of storing instructions which are executed by a programmable circuitry. When a component or a circuit is said to be "connected" or "coupled" to another component, or a component/circuit is said to be "connected" or "coupled" between two nodes, it may be directly coupled or connected to the other component or with an intermediate component therebetween. The connection or coupling between the components may be physical, logical, or a combination thereof. Conversely, when the component is said to be "directly coupled" or "directly connected" to another component, it means that there is no intermediate component therebetween.

Figure 3:
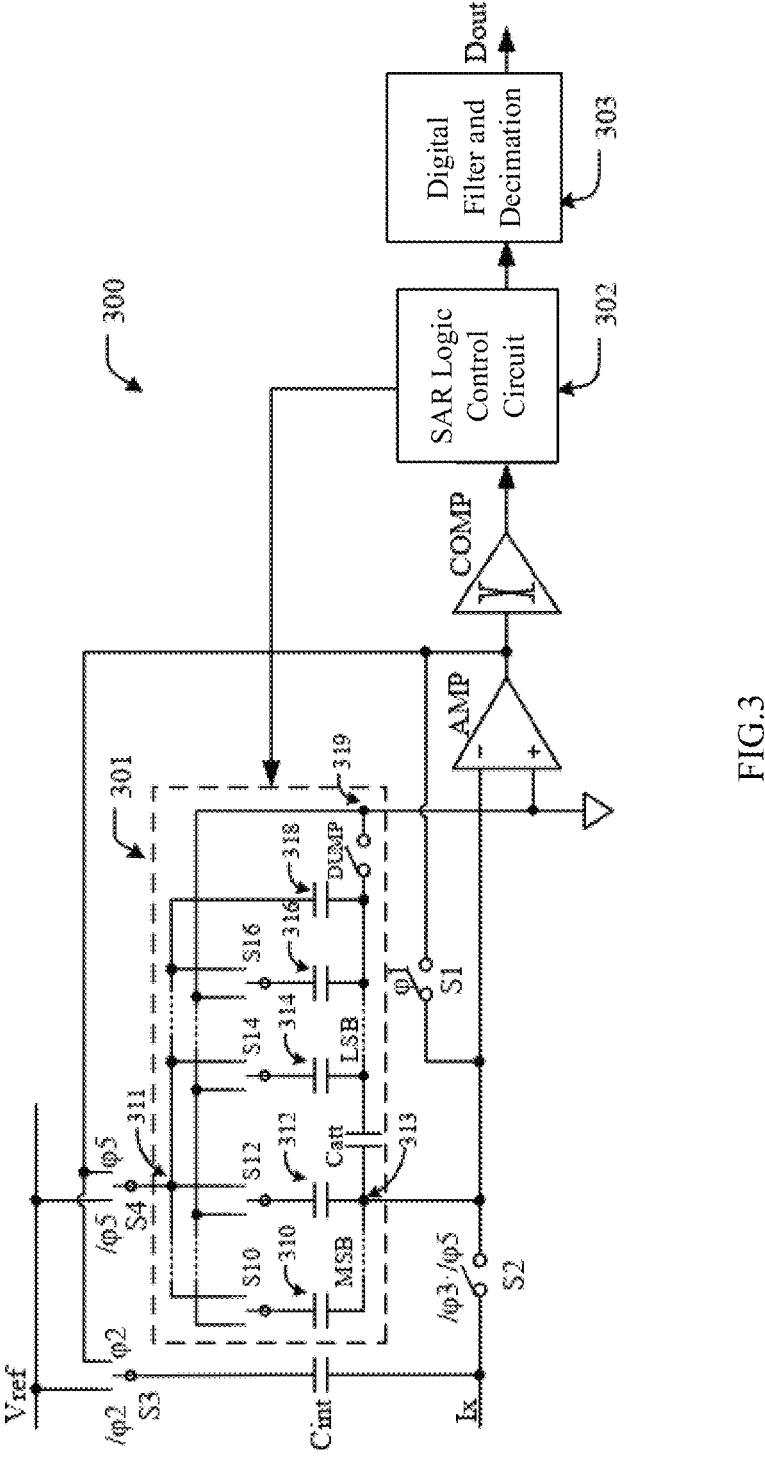
FIG. 3 shows a schematic diagram of a structure of an analog-to-digital converter according to an embodiment of the present disclosure.

FIG. 3 shows a schematic diagram of a structure of an analog-to-digital converter according to the present disclosure. As shown in FIG. 3, the analog-to-digital converter 300 designed according to the present disclosure includes: a capacitive digital-to-analog converter (CDAC) 301, an amplifier AMP, a comparator COMP, an SAR logic control circuit 302, a digital filter and decimation circuit 303, an auxiliary capacitor Cint, and a plurality of switches S1 to S4.

As shown in FIG. 3, the capacitive digital-to-analog converter 301 may include a plurality of weight capacitors, such as binary weight capacitors $2^{N-1}C$ . . . C, for example, the capacitors shown at 310-318, and a plurality of switches, for example, the switches S10-S16. Here, the weight capacitors 310 and 312 correspond to the quantization bits of higher weights, which are MSB capacitors, and the weight capacitors 314 and 316 correspond to the quantization bits of lower weights, which are LSB capacitors. A bridging capacitor Catt is coupled between the MSB capacitor array and the LSB capacitor array to ensure that the weights of the MSB capacitor array and the LSB capacitor array meet a binary relationship. That is, in the capacitive digital-to-analog converter 301, the weight of the total capacitance of the MSB capacitor array is equal to the weight of the total capacitance of the LSB capacitor array. The switches S10~S16 have two terminals and a common terminal. One terminal is coupled with a node 311, the other terminal is coupled to ground, and the common terminal of the switches S10~S16 are respectively coupled with an upper end of the weight capacitors 310~316. Moreover, the capacitive digital-to-analog converter 301 further includes a switch DUMP for grounding a lower end of the plurality of weight capacitors of the capacitive digital-to-analog converter 301 at an initialization phase.

One end of the switch S1 is coupled to a negative input terminal of the amplifier AMP, the other end is coupled to an output terminal of the amplifier AMP. A positive input terminal of the amplifier AMP is coupled to ground, and is coupled to the node 319 of the capacitive digital-to-analog converter 301. Here, the switch S1 is controlled by a signal $\varphi1$. When the signal $\varphi1$ is at a high level, the switch S1 is closed to couple the amplifier as a follower structure; when the signal $\varphi1$ is at a low level, the switch S1 is opened.

One end of the switch S2 is coupled to an input current signal Ix, the other end is coupled to lower ends of the weight capacitors 310 and 312 of the capacitive digital-to-analog converter 301 to the node 313, and is coupled to the negative input terminal of the amplifier AMP. Here, the switch S2 is controlled by complementary signals /$\varphi3$ and /$\varphi5$ of the signal $\varphi3$ and $\varphi5$. When the signal $\varphi3$ and $\varphi5$ are both at a low level, the complementary signals /$\varphi3$ and /$\varphi5$ are at a high level, and the switch S2 is closed. Conversely, the switch S2 is opened.

The switch S3 has two terminals and a common terminal. The first terminal is coupled to a reference voltage Vref, the second terminal is coupled with the output terminal of the amplifier AMP. The common terminal of the switch S3 is coupled with one end of the auxiliary capacitor Cint, and the other end of the auxiliary capacitor Cint is coupled to the input current signal Ix. Here, the switch S3 is controlled by signals $\varphi2$ and /$\varphi2$, wherein signal /$\varphi2$ is a complementary signal of signal $\varphi2$. The switch S3 is used to control an operation state of the auxiliary capacitor Cint according to the signal $\varphi2$. When the signal $\varphi2$ is at a low level, its complementary signal/$\varphi2$ is at a high level. The switch S3 connects the first terminal and the common terminal, and an upper end of the auxiliary capacitor Cint is coupled to the reference voltage Vref; When the signal φ2 is at a high level, the switch S3 connects the second terminal and the common terminal, and an upper end of the auxiliary capacitor Cint is coupled to the output terminal of the amplifier AMP.

The switch S4 has two terminals and a common terminal. The first terminal is coupled to the reference voltage Vref, the second terminal is coupled with the output terminal of the amplifier AMP, and the common terminal of the switch S4 is coupled with the node 311 of the capacitive digital-to-analog converter 301. Here, the switch S4 is controlled by signals φ5 and /φ5, wherein signal /φ5 is a complementary signal of signal φ5. The switch S4 is used to control an operation state of the weight capacitor array of the capacitive digital-to-analog converter 301 according to the signal φ5. When the signal φ5 is at a low level, its complementary signal /φ5 is at a high level. The switch S4 connects the first terminal and the common terminal, and couples an upper end of the weight capacitor array of the capacitive digital-to-analog converter 301 to the reference voltage Vref; When the signal φ5 is at a high level, the switch S4 connects the second terminal and the common terminal, and an upper end of the weight capacitor array of the capacitive digital-to-analog converter 301 is coupled to the output terminal of the amplifier AMP.

The input of the comparator COMP is coupled to the output terminal of the amplifier AMP, and the comparator COMP is used to quantize an output terminal of the amplifier AMP to be output as a digital code at the SAR conversion phase. At the SAR conversion phase, the amplifier AMP is in an open-loop state with a very high gain. An influence of threshold deviation of the comparator COMP is relatively small at its input. Therefore, in some embodiments, the comparator COMP can be implemented using a logic quantization comparator, i.e. a standard logic gate. Here, quantization thresholds correspond to pinch-off voltages of upper and lower transistors which are complementary inputs of the logic gate. The output of the comparator COMP is coupled with the SAR logic control circuit 302. The SAR logic control circuit 302 is used to control successive approximation (SAR) conversion in the capacitive digital-to-analog converter 301 according to the digital code, and continuously generates various bits from high to low in a successive approximation manner, until the end of quantization, and finally obtains an output digital code of the SAR ADC. The digital filter and decimation circuit 303 is coupled with the SAR logic control circuit 302, for decimating output digital codes of the SAR logic control circuit for many times and averaging the output digital codes to obtain an output digital signal of the whole analog-to-digital converter 300.

It can be understood that the SAR conversion process in the analog-to-digital converter 300 according to the present disclosure is similar to the conversion process of a traditional successive approximation register analog-to-digital converter (SAR ADC). First, an input current signal Ix is stored at the integration and sampling stages, as charges on weight capacitors which are arranged with binary weights. Then, various bits are confirmed bit by bit at the SAR conversion stage. The bit values of the capacitive digital-to-analog converter 301 can be adjusted according to an output of the comparator COMP. The SAR conversion may start with CDAC that is set to a lowest level, a highest level, or a middle level. The comparator COMP determines whether an output terminal of the amplifier AMP is higher or lower, and stores a comparison result as 1 or 0 of the bit of the capacitive digital-to-analog converter 301. The conversion then proceeds to the next bit value, until all of the bit values are determined and the entire quantization is end.

Moreover, in the capacitive SAR ADC approach, at the end of the SAR conversion, an output voltage at the output terminal of the capacitive DAC is still not exactly zero. The residual voltage is the difference between an input voltage to be quantized and an output value of the DAC converter, commonly referred to as the "residual error", which corresponds to a quantization error of the ADC. The analog-to-digital converter 300 according to the present disclosure also includes an integrated analog-to-digital conversion process for the quantization error of the capacitive DAC, which not only can push the quantization error away from a signal frequency band of interest, but also can accelerate a convergence rate of quantization, which will be further described in detail in conjunction with the following embodiments.

Figure 4:
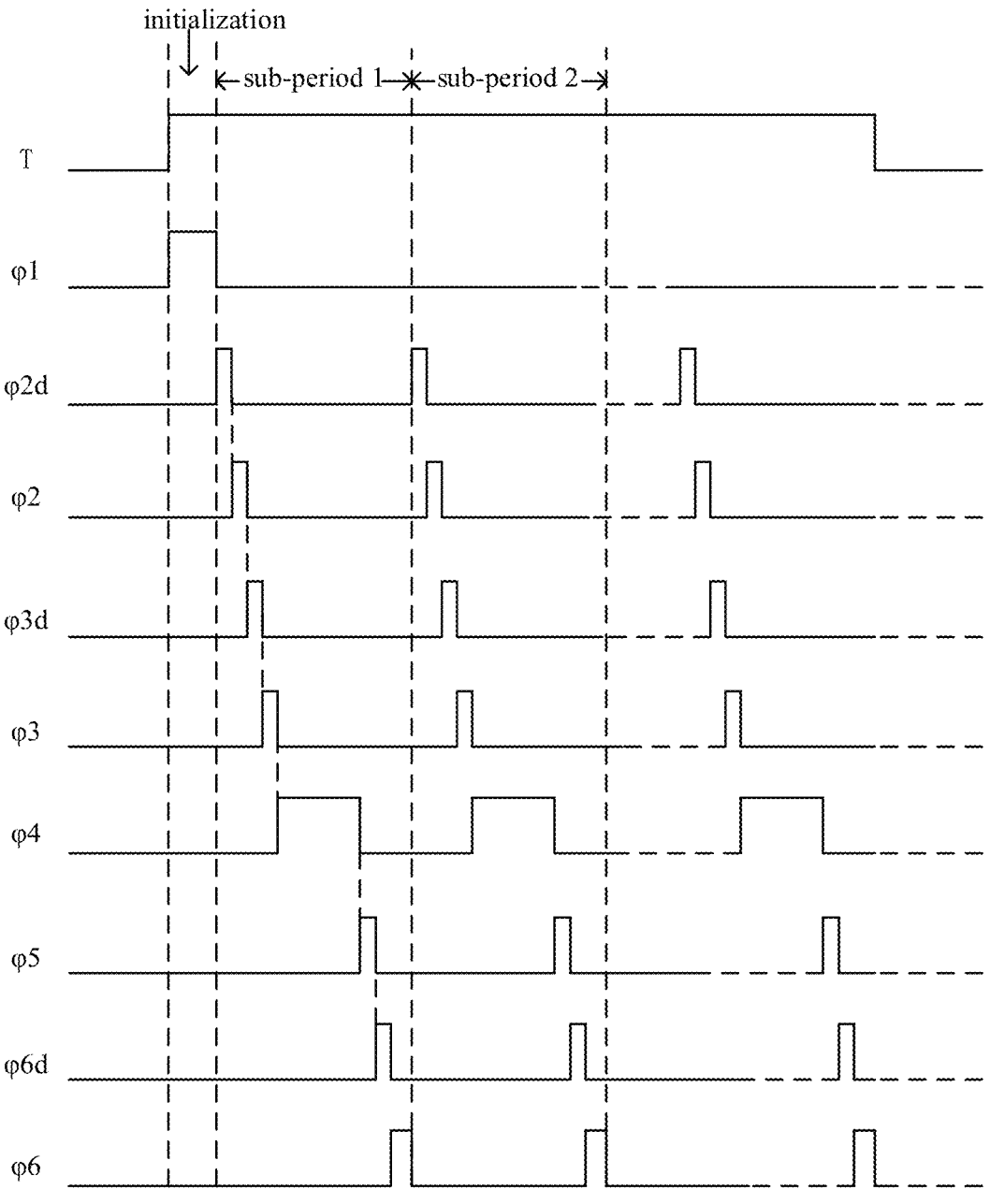
FIG. 4 shows a schematic diagram of timing charts of an analog-to-digital converter according to an embodiment of the present disclosure.

FIG. 4 shows a schematic diagram of timing charts of an analog-to-digital converter according to an embodiment of the present disclosure. In FIG. 4, the signals φ1~φ6 are control signals that control the plurality of switches S1~S4 in FIG. 3, and the signals φ2d, φ3d and φ6d are delay signals that avoid simultaneous close of the plurality of switches S1~S4. Each conversion frame T of the analog-to-digital converter according to the embodiment of the present disclosure includes an initialization phase and a plurality of sub-periods, and operations of each sub-period may be divided into the following stages: a residual charge storage phase, a reset phase, an integration phase, a charge redistribution phase, and an SAR conversion phase. The method of operating the analog-to-digital converter according to the present disclosure will be described in detail below in connection with FIGS. 3 and 4.

First, at the initialization phase during which the signal φ1 is at a high level, the switches S1 and S2 are closed. The switch S3 connects the first terminal and the common terminal, that is, an upper end of the auxiliary capacitor Cint is coupled to the reference voltage Vref. The switch S4 connects the first terminal and the common terminal, that is, the node 311 of the capacitive digital-to-analog converter is coupled to the reference voltage Vref. In such case, the amplifier AMP is connected as a follower structure. A lower plate potential of the auxiliary capacitor Cint and the weight capacitor array of the capacitive digital-to-analog converter are set to be equal to an offset voltage Vos of the amplifier AMP. An upper plate potential is set to be equal to the reference voltage Vref. In other words, the auxiliary capacitor Cint and the weight capacitor array of the capacitive digital-to-analog converter 311 are both charged to a potential of Vref-Vos, where Vos represents an offset voltage of the amplifier AMP. At this phase, an influence of the offset voltage Vos of the amplifier AMP on the conversion precision is eliminated.

At the residual charge storage phase during which the signal φ2 is at a high level, the switch S1 is opened, and the switch S2 is closed. The switch S3 connects the second terminal and the common terminal, that is, an upper end of the auxiliary capacitor Cint is coupled to an output terminal of the amplifier AMP. The switch S4 connects a first ground terminal and the common terminal, that is, the node 311 of the capacitive digital-to-analog converter 301 is coupled to the reference voltage Vref. In such case, the auxiliary capacitor Cint is coupled between a negative input terminal and an output terminal of the amplifier AMP, and stores residual charge which is generated by switching operations of the capacitive digital-to-analog converter 301 in the previous sub-period via the amplifier AMP. The residual charge is superimposed on the integration charge of the auxiliary capacitor Cint. The residual charge is the one after quantization of the lowest bit (LSB bit) of the capacitive digital-to-analog converter 301. Further, in the first sub-period of each conversion frame T, the residual charge storage phase φ2 is immediately after the initialization phase φ1. Since the auxiliary capacitor Cint and the weight capacitors in the capacitive digital-to-analog converter 301 has just been charged to the same potential, the above-mentioned charge balancing process does not exist.

At the reset phase during which the signal φ3 is at a high level, the switches S1 and S2 are opened. The switches S3 and S4 connect the first terminal and the common terminal, that is, the auxiliary capacitor Cint and the node 311 of the capacitive digital-to-analog converter 301 are coupled to the reference voltage Vref, respectively. In such case, the weight capacitor array of the capacitive digital-to-analog converter 301 is charged to the potential of Vref-Vos again.

At the integration phase during which the signal φ4 is at a high level, the switch S1 is opened, and the switch S2 is closed. The switches S3 and S4 connects the first terminal and the common terminal, that is, the auxiliary capacitor Cint and the node 311 of the capacitive digital-to-analog converter 301 are coupled to the reference voltage Vref, respectively. In such case, the plurality of switches S10~S16 in the capacitive digital-to-analog converter 301 are thrown to the right, that is, upper plate of the plurality of weight capacitors in the capacitive digital-to-analog converter 301 is coupled to the reference voltage Vref. In such case, the weight capacitor array of the capacitive digital-to-analog converter and the auxiliary capacitor Cint together integrate the input current signal Ix.

At the charge redistribution phase during which the signal φ5 is at a high level, the switches S1 and S2 are opened. The switch S4 connects the second terminal and the common terminal, that is, an output terminal of the capacitive digital-to-analog converter 301 is coupled to a negative input terminal of the amplifier AMP. In such case, the weight capacitor array of the capacitive digital-to-analog converter 301 is coupled between the negative input terminal and an output terminal of the amplifier AMP, and integration charge of the auxiliary capacitor Cint in the current sub-period is transferred to the weight capacitor array of the capacitive digital-to-analog converter 301 through the amplifier AMP.

At the SAR conversion phase during which the signal φ6 is at a high level, the switch S1 is closed, and the switch S2 is opened. The switches S3 and S4 connects the first terminal and the common terminal. The SAR logic control circuit 302 controls successive approximation (SAR) conversion in the capacitive digital-to-analog converter 301 according to a digital code output from the comparator COMP, and continuously generates various bits from high to low in a successive approximation manner, until the end of quantization, and finally obtains an output digital code of the SAR ADC. The above process is repeated. The digital filter and decimation circuit 303 averages output digital codes of the SAR logic control circuit for many times to obtain an output digital signal of the whole analog-to-digital converter 300.

Further, in each sub-period, the analog-to-digital converter according to the embodiment of the present disclosure further includes a first dead time φ2d, a second dead time φ3d, and a third dead time φ6d, which are respectively located before the residual charge storage phase, the reset phase, and the SAR conversion phase, to prevent simultaneous close of switches when switching between different phases.

In the analog-to-digital converter according to the present disclosure, the input current signal is preliminarily quantized using an SAR ADC, and then a residual error after the initial quantization is decimated by an auxiliary capacitor, and then is converted by integrated analog-to-digital conversion. Residual errors after a plurality of times of conversions are randomly distributed within a sampling bandwidth of one weight value of one LSB, and thus appears as an ideal white noise. Therefore, not only an quantization error of the DAC can be eliminated, but also a convergence rate of quantization can be increased, while balancing the resolution and the conversion speed of the SAR ADC.

Moreover, the analog-to-digital converter (ADC) according to the present disclosure introduces the design of an auxiliary capacitor and a weight capacitor array to cooperate with each other to ensure continuous integration. First of all, except for the moment that the switch S3 switches, the integration of the auxiliary capacitor Cint on an input current signal Ix is always continuous, and except for the SAR conversion phase, the weight capacitor array always participates in the integration of the input current signal Ix. Considering that integration charge accumulated on the auxiliary capacitor Cint is transferred to the weight capacitor array at the charge redistribution phase φ5, the entire conversion frame T is a process of successive approximation to quantize the continuous integration total charge of the input current signal Ix, and a residual error is transferred to a next quantization process. The time utilization rate is high, and the signal-to-noise ratio is high.

Further, a conversion gain of the analog-to-digital converter according to the present disclosure is mainly determined by the time of the integration phase. The conversion gain of the analog-to-digital converter according to the present disclosure can be changed only by controlling the time of the phase φ3, which is very convenient for control.

In summary, the analog-to-digital converter according to the present disclosure includes a capacitive digital-to-analog converter and an auxiliary capacitor. With the design that the auxiliary capacitor and the capacitive digital-to-analog converter store and decimate charges therebetween, it ensures that the analog-to-digital converter performs continuous integration of an input current signal in the whole conversion frame. Thus, the time utilization rate and the signal-to-noise ratio are improved.

Moreover, in the analog-to-digital converter according to the present disclosure, the input current signal is preliminarily quantized using an SAR ADC, and then a residual error after the initial quantization is decimated by an auxiliary capacitor, and then is converted by integrated analog-to-digital conversion. Residual errors after a plurality of times of conversions are randomly distributed within a sampling bandwidth of one weight value of one LSB, and thus appears as an ideal white noise. Therefore, not only an quantization error of the DAC can be eliminated, but also a convergence rate of the quantization result can be increased, while balancing the resolution and the conversion speed of the SAR ADC.

Furthermore, the analog-to-digital converter according to the present disclosure employs the weight capacitor array of a capacitive digital-to-analog converter as primary integration capacitors. The auxiliary capacitor is only responsible for maintaining uninterrupted integration at the integration phase. Therefore, it can be implemented using a small-capacity capacitor, simplifying the engineering process and reducing both the circuit area and cost.

It will be appreciated by those of ordinary skill in the art that the words "during", "when", and "while" used herein in connection with circuit operation are not strict terms for actions that occur immediately at the beginning of a start action, but that there may be some small but reasonable one or more delays after a reaction action initiated by a start action, such as various transmission delays, etc. As used herein, the word "approximately" or "substantially" means an element has a parameter that is expected to approximate the declared value or location. However, as is well known in the art, there are always minor deviations that make it difficult to have the value or position to be strictly the declared value. It has been properly determined in the art that a deviation of at least ten percent (10%) is a reasonable deviation from the precise desired target described (for a doping concentration of semiconductor, at least twenty percent (20%)). When a signal is described in the context of a state, an actual voltage value or logic state of the signal (e.g. "1" or "0") depends on whether positive or negative logic is used.

It should also be noted that in this description, relational terms such as first and second are merely used to distinguish one entity or operation from another, and do not necessarily require or imply that there is any such actual relationship or sequence among these entities or operations. Furthermore, the word "include", "contain", or any other variation thereof is intended to cover non-exclusive inclusion, so that a process, method, article, or device including a series of elements includes not only those elements, but other elements that are not explicitly listed or elements inherent to such process, method, article, or device. In the absence of further limitations, elements defined by the phrase "comprises a . . . " do not exclude the presence of additional identical elements in the process, method, article, or device that includes the elements.

In accordance with the embodiments of the present disclosure, such as described above, these embodiments do not describe all the details in detail, nor do they limit the invention to the specific embodiments described. Obviously, a lot of modifications and changes can be made based on the above description. These embodiments are selected and specifically described in this specification in order to better explain the principles and practical applications of the present disclosure, so that those skilled in the art can make good use of the present disclosure and its modifications on the basis of the present disclosure. The present disclosure is limited only by the claims and their full scope and equivalents.

What is claimed is:

1. An analog-to-digital converter, having a plurality of sub-periods in one conversion frame, and performing at least the following operations of the analog-to-digital converter in each sub-period: a residual charge storage phase, an integration phase, a charge redistribution phase, and an SAR conversion phase, wherein the analog-to-digital converter comprises:

a capacitive digital-to-analog converter, comprising a weight capacitor array that generates residual charge by switching;

an auxiliary capacitor, configured to store residual charge generated by the capacitive digital-to-analog converter in a previous sub-period at the residual charge storage phase, integrate an input current signal in addition to the weight capacitor array at the integration phase, and transfer the integration charge for the current sub-period to the weight capacitor array at the charge redistribution phase;

an amplifier that is coupled to the capacitive digital-to-analog converter and the auxiliary capacitor for performing charge transfer between the auxiliary capacitor and the weight capacitor array of the capacitive digital-to-analog converter;

a comparator that has an input being coupled to an output terminal of the amplifier, and is used for quantizing the output terminal of the amplifier to obtain a digital code;

an SAR logic control circuit for controlling switching operations of the capacitive digital-to-analog converter according to the digital code at the SAR conversion phase, and continuously generating various bits in a successive approximation manner, until the end of quantization; and a digital filter and decimation circuit for averaging a plurality of digital codes output from the SAR logic control circuit to obtain an output digital signal corresponding to the input current signal, wherein the auxiliary capacitor has a first end receiving the input current signal and a second end selectively coupled to a preset potential, the capacitive digital-to-analog converter and the output terminal of the amplifier.

2. The analog-to-digital converter according to claim 1, wherein the one conversion frame of the analog-to-digital converter further includes an initialization phase, at which the weight capacitor array of the capacitive digital-to-analog converter and the auxiliary capacitor are both charged to the preset potential, wherein the preset potential is equal to a voltage difference between a preset reference voltage and an offset voltage of the amplifier.

3. The analog-to-digital converter according to claim 2, wherein each sub-period of the conversion frame further includes a reset phase after the residual charge storage phase, at which the weight capacitor array of the capacitive digital-to-analog converter is charged again to the preset potential.

4. The analog-to-digital converter according to claim 1, wherein the analog-to-digital converter is configured to:

couple the auxiliary capacitor to a negative input terminal and an output terminal of the amplifier at the residual charge storage phase to extract residual charge in the weight capacitor array by the amplifier.

5. The analog-to-digital converter according to claim 1, wherein the analog-to-digital converter is configured to:

couple the auxiliary capacitor and the weighted capacitor array of the capacitance-type digital-to-analog converter respectively between a preset reference voltage and the input current signal at the integration stage to integrate the input current signal.

6. The analog-to-digital converter according to claim 1, wherein the analog-to-digital converter is configured to:

couple the weight capacitor array of the capacitive digital-to-analog converter between a negative input terminal and an output terminal of the amplifier at the charge redistribution phase to extract integration charge on the auxiliary capacitor by the amplifier.

7. The analog-to-digital converter according to claim 1, further comprising a plurality of switches, the plurality of switches being switched to control connection states of the auxiliary capacitor, the capacitive digital-to-analog converter, and the amplifier at different phases.

8. The analog-to-digital converter according to claim 7, wherein the plurality of switches comprises at least a first to a fourth switch, the first switch is used to couple the negative input terminal and the output terminal of the amplifier, the second switch is used to couple a lower end of the weight capacitor array to the input current signal, the third switch is used to couple an upper end of the auxiliary capacitor with a reference voltage or an output terminal of the amplifier, the fourth switch is used to couple an upper end of the weight capacitor array with the reference voltage or the output terminal of the amplifier.

9. The analog-to-digital converter according to claim 8, wherein the first switch is controlled by a first signal, the second switch is controlled by complementary signals of a third signal and a fifth signal, the third switch is controlled by a second signal and a complementary signal of the second signal, the fourth switch is controlled by a fifth signal and a complementary signal of the fifth signal, wherein, in each sub-period, the first signal to the fifth signal are signals that do not overlap with each other.

10. The analog-to-digital converter according to claim 1, wherein the weight capacitor array is a binary capacitor array.

11. A method of operating the analog-to-digital converter according to claim 1, comprising:

storing residual charge that is generated by switching operations of the capacitive digital-to-analog converter in a previous sub-period into an auxiliary capacitor;

integrating an input current signal using both the auxiliary capacitor and a weighted capacitor array of the capacitive digital-to-analog converter;

transferring integration charge accumulated on the auxiliary capacitor in the current sub-period to the weight capacitor array;

quantizing an output of the capacitive digital-to-analog converter into a digital code, controlling switching operations of the capacitive digital-to-analog converter according to the digital code by the SAR logic control circuit, and continuously generating various bits in a successive approximation manner, until the end of quantization;

repeating the steps of storing the residual charge, integrating the input current signal, transferring the integration charge, and quantizing the output of the capacitive digital-to-analog converter; and averaging a plurality of digital codes output from the SAR logic control circuit to obtain an output digital signal corresponding to the input current signal.

12. The method according to claim 11, further comprising: an initialization phase at which a weight capacitor array of the capacitive digital-to-analog converter and the auxiliary capacitor are both charged to a preset potential, wherein the preset potential is equal to a voltage difference between a preset reference voltage and an offset voltage of the amplifier.

13. The method according to claim 12, wherein the step of storing residual charge that is generated by the switching operations of the capacitive digital-to-analog converter in a previous sub-period into the the auxiliary capacitor further comprises: charging the weight capacitor array of the capacitive digital-to-analog converter again to the preset potential.

14. The method according to claim 11, further comprising:

coupling the amplifier to the capacitive digital-to-analog converter and the auxiliary capacitor, respectively, to achieve charge transfer between the auxiliary capacitor and the weight capacitor array of the capacitive digital-to-analog converter.

15. The method according to claim 14, wherein the step of storing the residual charge generated by the switching operations of the capacitive digital-to-analog converter in the previous sub-period into the auxiliary capacitor comprises:

coupling the auxiliary capacitor to an negative input terminal and an output terminal of the amplifier to extract residual charge in the weight capacitor array by the amplifier.

16. The method according to claim 14, wherein the step of integrating an input current signal using both the auxiliary capacitor and the weight capacitor array of the capacitive digital-to-analog converter comprises:

coupling the auxiliary capacitor and the weight capacitor array of the capacitive digital-to-analog converter respectively between a preset reference voltage and the input current signal to integrate the input current signal.

17. The method according to claim 14, wherein the step of transferring integration charge accumulated on the auxiliary capacitor in the current sub-period to the weight capacitor array comprises:

coupling the weight capacitor array of the capacitive digital-to-analog converter between a negative input terminal and an output terminal of the amplifier to extract integration charge accumulated on the auxiliary capacitor by the amplifier.

18. The method of claim 14, further comprising:

providing a plurality of switches to control connection states of the auxiliary capacitor, the capacitive digital-to-analog converter, and the amplifier at different phases by switching the plurality of switches.

19. The method according to claim 18, wherein the step of providing the plurality of switches comprises:

coupling an negative input terminal and an output terminal of the amplifier by a first switch, and/or coupling a lower end of the weight capacitor array to the input current signal by a second switch, and/or coupling an upper end of the auxiliary capacitor to a reference voltage or the output terminal of the amplifier by a third switch, and/or coupling an upper end of the weight capacitor array to the reference voltage or the output terminal of the amplifier by a fourth switch.

* * * * *